United States Patent [19]

Watanabe et al.

[11] Patent Number: 4,910,426
[45] Date of Patent: Mar. 20, 1990

[54] THREE-TRANSDUCER SAW DEVICE INCLUDING ONE OR TWO APODIZED TRANSDUCERS HAVING MINIMUM-PHASE AND MAXIMUM-PHASE IMPULSE RESPONSES

[75] Inventors: Takaya Watanabe; Shigeo Fushimi, both of Tokyo, Japan

[73] Assignee: NEC Corporation, Tokyo, Japan

[21] Appl. No.: 249,156

[22] Filed: Sep. 26, 1988

[30] Foreign Application Priority Data

Sep. 25, 1987 [JP] Japan ................................ 62-242204

[51] Int. Cl.$^4$ ............................................. H01L 41/08
[52] U.S. Cl. ............................ 310/313 C; 310/313 D
[58] Field of Search ...................... 310/313 C, 313 D; 333/154, 195, 193

[56] References Cited

U.S. PATENT DOCUMENTS

| 4,025,880 | 5/1977 | Coussot | 310/313 C X |
| 4,044,321 | 8/1977 | Vasile | 310/313 C X |
| 4,047,130 | 9/1977 | Lim et al. | 310/313 C X |
| 4,066,985 | 1/1978 | Kuny | 310/313 C X |
| 4,346,322 | 8/1982 | Sato et al. | 310/313 C |
| 4,513,261 | 4/1985 | Yen et al. | 310/313 C X |
| 4,634,913 | 1/1987 | Whatmore et al. | 310/313 D X |

FOREIGN PATENT DOCUMENTS 197712 12/1977 U.S.S.R. ................................ 333/193

Primary Examiner—Mark O. Budd
Attorney, Agent, or Firm—Sughrue, Mion, Zinn, Macpeak & Seas

[57] ABSTRACT

In a three-transducer surface acoustic wave device, an apodized electrode member is interposed between two interdigital electrode members, each having first and second ends and comprising interdigital electrodes between the first and the second ends either with a uniform density distribution or with a density distribution varied according to a prescribed rule of selective withdrawal of the interdigital electrodes. The apodized electrode member has first and second extremities and is given substantially minimum-phase and maximum-phase impulse responses for surface acoustic waves which are propagated either into or out of the apodized electrode member through one and the other of the extremities. Alternatively, an interdigital electrode member is interposed between two apodized electrode members. Each of the interdigital and the apodized electrode members is of the type described above. One of the apodized electrode member should have a substantially minimum-phase impulse response. The other should have a substantially maximum-phase impulse response.

7 Claims, 3 Drawing Sheets

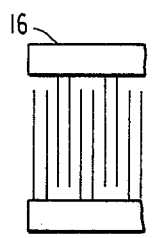
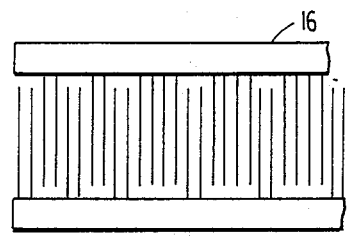
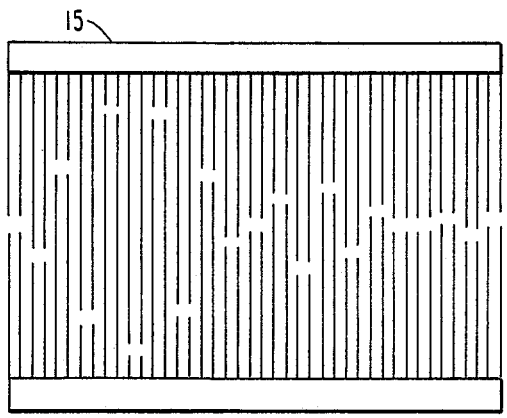
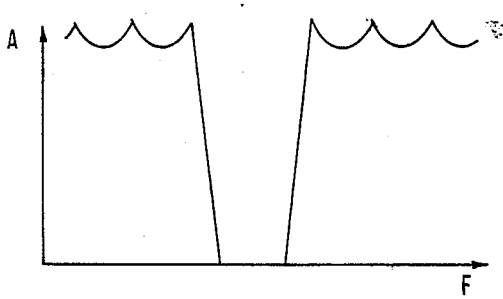
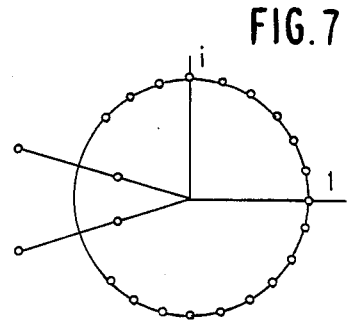
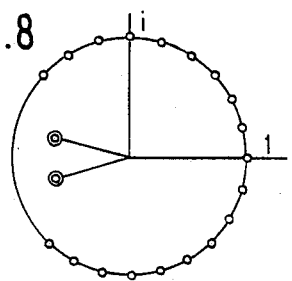
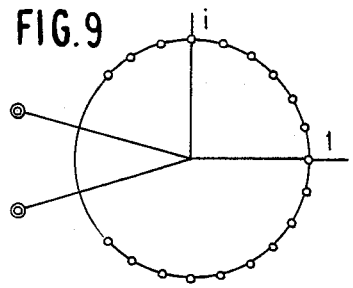

THREE-TRANSDUCER SAW DEVICE INCLUDING ONE OR TWO APODIZED TRANSDUCERS HAVING MINIMUM-PHASE AND MAXIMUM-PHASE IMPULSE RESPONSES

BACKGROUND OF THE INVENTION

This invention relates to a surface acoustic wave device.

A surface elastic wave is ordinarily called a surface acoustic wave (SAW) in the art. A surface acoustic wave device comprises a substrate of a piezoelectric material, such as quartz, having a principal surface and at least two electrode members on the principal surface. Each electrode member serves as a transducer between an electric signal and surface acoustic waves which are propagated along the principal surface. The surface acoustic wave device is used in electric communication apparatus usually as a band-pass filter. Consequently, the surface acoustic wave device must have an excellent outband characteristic in addition to an excellent passband characteristic. Furthermore, the surface acoustic wave device must have a small insertion loss.

Various surface acoustic wave devices are already known. For example, a conventional surface acoustic wave device comprises first through third interdigital electrode members. It is known in the art that an interdigital electrode member comprises a pair of parallel strip electrodes and a plurality of interdigital electrodes extended perpendicularly from the strip electrodes in an interdigital fashion with a predetermined width of interlock formed along each pair of interdigital electrodes extended from the respective strip electrodes. For convenience of the description which follows, each interdigital electrode member will be said to have first and second ends at two of the interdigital electrodes that are extended at outermost extremities.

The first through the third interdigital electrode members are arranged on the principal surface of the substrate in succession with the strip electrodes disposed colinear and with a space left between the first and the second ends of two adjacent interdigital electrode members. The surface acoustic wave device is used as a three-transducer device. More particularly, the second interdigital electrode member is used as a driving transducer with the first and the third interdigital electrode members used as driven transducers. Alternatively, the first and the third interdigital electrode members are used as driving transducers with the second interdigital electrode member used as a driven transducer.

When supplied with an input electric signal of a high frequency, the driving transducer excites surface acoustic waves which travel along the principal surface perpendicularly of the interdigital electrodes with the high frequency and with a wavelength dependent on the substrate. Each pair of the interdigital electrodes has a center-to-center spacing which is equal to a half of the wavelength. The driven transducer transduces the surface acoustic wave arriving thereat into an output electric signal.

Another conventional surface acoustic wave device comprises two apodized electrode members as a driving and a driven transducer. In the manner which will later be described in detail, an apodized electrode member comprises a pair of parallel strip electrodes and a plurality of finger electrodes which are perpendicularly extended from the strip electrodes and have weighted finger lengths perpendicularly of the strip electrodes. Each pair of the finger electrodes has a center-to-center spacing which is equal to a half of the wavelength of the surface acoustic waves. Like the interdigital electrode member, each apodized electrode member has first and second extremities at two of the finger electrodes that are most outwardly arranged. Besides an apodized electrode member having a substantially linear-phase impulse response, a different apodized electrode member is known which has substantially minimum-phase and maximum-phase impulse responses for the surface acoustic waves propagated through one and the other of the first and the second extremities, respectively.

Still another conventional surface acoustic wave device comprises an interdigital electrode member and an apodized electrode member. When either no or only one apodized electrode member is included, the surface acoustic wave device has not sufficiently excellent outband characteristics. When only two electrode members are used, the surface acoustic wave device has a considerably great insertion loss.

SUMMARY OF THE INVENTION

It is therefore an object of the present invention to provide a surface acoustic wave device which is capable of serving as a band-pass filter having an excellent band-rejection characteristic.

It is another object of this invention to provide a surface acoustic wave device of the type described, which has a small insertion loss.

Other objects of this invention will become clear as the description proceeds.

On describing the gist of this invention, it is possible to understand that a surface acoustic wave device includes a first interdigital electrode member having a predetermined width of interlock and an apodized electrode member having first and second extremities and substantially minimum-phase and maximum-phase impulse responses for first and second surface acoustic waves, respectively, which first and second surface acoustic waves are propagated through the first and the second extremities, respectively. In the thus-understood surface acoustic wave device, the apodized and the first interdigital electrode members are arranged to propagate a selected one of the first and the second surface acoustic waves therebetween. According to a first aspect of this invention, the above-understood surface acoustic wave device is characterized by a second interdigital electrode member and connecting means for electrically connecting the first and the second interdigital electrode members together. The second interdigital electrode member has the predetermined width of interlock. The apodized and the second interdigital electrode members are arranged to propagate the other of the first and the second surface acoustic waves therebetween.

On describing the gist of this invention, it is moreover possible to understand that a surface acoustic wave device includes an interdigital electrode member having first and second ends and a predetermined width of interlock and a first apodized electrode member having a substantially minimum-phase impulse response for a first surface acoustic wave propagated between the interdigital and the first apodized electrode members through the first end. According to a second aspect of this invention, the above-understood surface acoustic wave device is characterized by a second apodized electrode member and connecting means for electrically connecting the first and the second apodized electrode members together. The second apodized electrode member has a substantially maximum-phase impulse response for a second surface acoustic wave propagated between the interdigital and the second apodized electrode members through the second end.

BRIEF DESCRIPTION OF THE DRAWING:

FIG. 2 is a detailed partial top view of an interdigital electrode member which is used in the surface acoustic wave device illustrated in FIG. 1;

FIG. 3 is a detailed partial top view of another interdigital electrode member for use in the surface acoustic wave device depicted in FIG. 1;

FIG. 4 shows, on a scale which is different from that used in each of FIGS. 2 and 3, a detailed schematic top view of an apodized electrode member which is used in the surface acoustic wave device depited in FIG. 1;

FIG. 6 exemplifies an attenuation characteristic of a band-pass filter;

FIG. 7 shows an example of zero points of a linear-phase finite impulse response filter;

FIG. 8 exemplifies zero points of a minimum-phase finite impulse response filter; and FIG. 9 exemplifies zero points of a maximum-phase finite impulse response filter.

DESCRIPTION OF THE PREFERRED EMBODIMENTS

Figure 1:
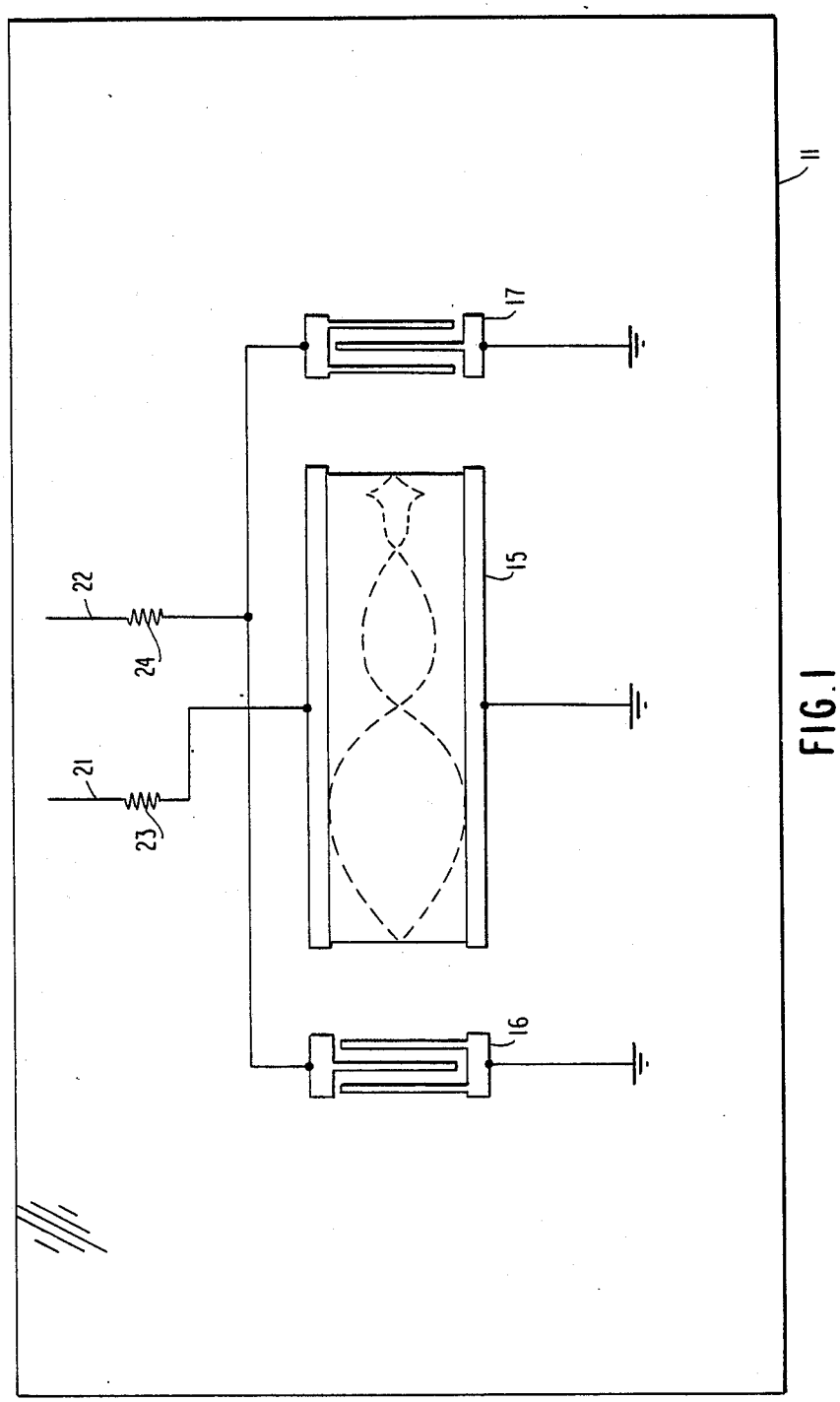
FIG. 1 is an enlarged schematic top view of a surface acoustic wave device according to a first embodiment of the instant invention.

Referring to FIG. 1, surface acoustic waves (SAW) are used in a surface acoustic wave device according to a first embodiment of the present invention. The surface acoustic wave device comprises a substrate 11 made of a piezoelectric material and having a principal surface. The substrate 11 is rectangular in outline and has a pair of longer sides and a pair of shorter sides. In the manner known in the art, the surface acoustic waves are propagated along the principal surface.

An apodized electrode member 15 is formed centrally on the principal surface. The apodized electrode member 15 comprises first and second parallel strip electrodes (bus bars) depicted as upper and lower horizontally long rectangles. In the manner which will be described more in detail as the description proceeds, the apodized electrode member 15 comprises a plurality of finger electrodes stretched from the strip electrodes vertically of the figure to have weighted finger lengths which are determined by weighting or apodization coefficients and are symbolically indicated by dashed-line curves having a main lobe or loop and a few side lobes. The main lobe is depicted leftwardly of the figure merely by way of example.

It should be understood that the gaps are formed between the tips of the finger electrodes expending from one strip electrodes and those extending from another strip electrode. The gaps are formed along the dashed-line curves. The weighted finger lengths refer also to those of the finger electrodes which are formed inwardly of the lobes.

The apodized electrode member 15 has first and second extremities at two of the finger electrodes that are most outwardly arranged. Merely for convenience of the description, it will be understood that the first and the second extremities are shown by left and right vertical line segments indicative of the outline of the apodized electrode member 15 in cooperation with the horizontally long rectangles.

First and second interdigital electrode members 16 and 17 are formed on the principal surface of the substrate 11 leftwardly and rightwardly of the figure. It is known in the art that each interdigital electrode member comprises first and second parallel strip electrodes and a plurality of interdigital electrodes which are extended perpendicularly from the strip electrodes in an interdigital or interlocking fashion to have a predetermined width of interlock along each pair of interdigital electrodes extended from the respective strip electrodes.

Only two pairs of interdigital electrodes are depicted merely for simplicity of illustration. More specifically, a center electrode is extended downwardly from the first strip electrode of the first interdigital electrode member 16. Left and right electrodes are extended upwardly from the second strip electrode. A center electrode is extended upwardly from the second strip electrode of the second interdigital electrode member 17. Left and right electrodes are extended downwardly from the first strip electrode. The width of interlock is a vertical length of a spacing between the center electrode and each of the left and the right electrodes. The number of pairs are often referred to as the number of taps.

Each interdigital electrode member has first and second ends at two of the interdigital electrodes that are arranged at outermost extremities. In correspondence to the first and the second extremities of the apodized electrode member 15, the first and the second ends will be understood to be at left and right outermost extremities of the interdigital electrodes. In the example being illustrated, the first and the second ends are determined by the left and the right electrodes of each interdigital electrode member.

In FIG. 1, the first interdigital electrode member 16, the apodized electrode member 15, and the second interdigital electrode member 17 are arranged on the principal surface of the substrate 11 in succession with the strip electrodes disposed colinear and with first and second spaces left between the first extremity and the second end of the first interdigital electrode member 16 and between the second extremity and the first end of the second interdigital electrode member 17. The first and the second spaces are equal to each other.

A first lead 21 is electrically connected to the first strip electrode of the apodized electrode member 15. A second lead 22 is electrically connected to the first strip electrodes of the first and the second interdigital electrode members 16 and 17. In the illustrated example, ground is applied to the second strip electrodes of the electrode members 15 through 17. The first and the second leads 21 and 22 may or may not be formed on the principal surface of the substrate 11. It should be noted that the first and the second leads 21 and 22 should be electrically insulated from each other.

In cooperation with the ground applied to the second strip electrodes of the first and the second interdigital electrode members 16 and 17, the second lead 22 serves as a connecting arrangement for electrically connecting the first and the second interdigital electrode members 16 and 17 together. Incidentally, first and second resistors 23 and 24 are used in the first and the second leads 21 and 22 for impedance match. Each of the resistors 23 and 24 may have a resistance value of 50 ohms.

In this manner, the surface acoustic wave device is operable as a three-transducer device. For example, the apodized electrode member 15 is used as a driving transducer. In this event, the first and the second interdigital electrode members 16 and 17 are used as driven transducers. The first lead 21 is used as an input lead. The second lead 22 is used as an output lead.

Turning to FIG. 2 during a short while, it is preferred to use double electrode geometry in each of the first and the second interdigital electrode members 16 and 17. More particularly, the first interdigital electrode member 16 is of a normal type of the double electrode geometry wherein two parallel electrodes are used in place of each of the interdigital electrodes depicted in FIG. 1. Under the circumstances, two leftmost electrodes and two adjacently depicted electrodes form a pair of interdigital electrodes. The two last-mentioned electrodes and two further adjacently depicted electrodes form another pair of interdigital electrodes. In other words, two taps are formed by such six interdigital electrodes. It should be noted in connection with FIG. 2 that the interdigital electrodes of each interdigital electrode member are arranged between the first and the second ends with the predetermined width of interlock and with a uniform density distribution of the interdigital electrodes.

Further turning to FIG. 3, each of the first and the second interdigital electrode members 16 and 17 is of a modified type of the double electrode geometry. When compared with the interdigital electrodes described in conjunction with FIG. 2, the interdigital electrodes are selectively withdrawn in FIG. 3 according to a prescribed rule of selective withdrawal. Remaining interdigital electrodes are rearranged to fill spaces which would otherwise be left as a result of the selective withdrawal.

In the example illustrated in FIG. 3, two upwardly extended electrodes are withdrawn as withdrawd electrodes. Adjacent the withdrawn electrodes, two downwardly extended electrodes are rearranged to form a group of four downwardly side by side extended electrodes between two upwardly extended electrodes and two other upwardly extended electrodes. It is usual that the interdigital electrodes are not withdrawn near the first and the second ends. It is understood in connection with FIG. 3 that the interdigital electrodes are arranged between the first and the second ends of each interdigital electrode member with the predetermined width of interlock and with a density distribution varied in accordance with a predetermined rule which is determined by the prescribed rule of selective withdrawal.

Referring to FIG. 4, the apodized electrode member 15 is again of the double electrode geometry. The finger lengths are determined in the manner which will later be described more in detail.

Referring back to FIG. 1, operation will be described. It will be assumed that the apodized electrode member 15 is used as the driving transducer in the manner described before. An input electric signal of an input high frequency is supplied to the apodized electrode member 15 across the first lead 21 and ground. Responsive to the input electric signal, the apodized electrode member 15 excites surface acoustic waves which are propagated along the principal surface of the substrate 11 perpendicularly of the finger electrodes with the high frequency and with a wavelength dependent on the substrate 11. In this manner, the driving transducer transduces the input electric signal into the surface acoustic waves.

It is possible to use the first and the second interdigital electrode members 16 and 17 as driving transducers. In this event, the apodized electrode member 15 is used as a driven transducer. The first and the second leads 21 and 22 are used as an output and an input lead. Under the circumstances, it is possible to understand that the second lead 22 supplies the input electric signal to the first and the second interdigital electrode members 16 and 17 as first and second electric signals, respectively.

Supplied with the first electric signal, the first interdigital electrode member 16 excites a first surface acoustic wave which is propagated along the principal surface of the substrate 11 perpendicularly of the interdigital electrodes towards the apodized electrode member 15. The second interdigital electrode member 17 transduces the second electric signal into a second surface acoustic wave which travels along the principal surface towards the apodized electrode member 15.

In order so to excite the surface acoustic waves, each pair of the interdigital electrodes of the first and the second interdigital electrode members 16 and 17 of the normal type has a center-to-center spacing which is equal to a half of the wavelength of the surface acoustic waves. Even when the interdigital electrode members 16 and 17 are of the modified type, a like pair of the interdigital electrodes is given a center-to-center spacing which is equal to a half of the wavelength. A similar pair of the finger electrodes of the apodized electrode member 15 is given a center-to-center spacing which is equal to a half of the wavelength.

The first surface acoustic wave reaches the apodized electrode member 15 and enters the apodized electrode member 15 through the first extremity. The second surface acoustic wave enters the apodized electrode member 15 through the second extremity. In the illustrated example, the first extremity is near to the main lobe. The second extremity is remote from the main lobe. Under the circumstances, the first surface acoustic wave is subjected to a substantially minimum-phase impulse response in the apodized electrode member 15. The second surface acoustic wave is subjected to a substantially maximum-phase impulse response in the apodized electrode member 15.

It should be noted in connection with the above that the apodized electrode member 15 has a finite length horizontally of the figure and consequently a finite number of lobes. As a result, the apodized electrode member 15 have not precisely minimum-phase and maximum-phase impulse responses but approximately minimum-phase and maximum-phase impulse responses. It is now understood that the apodized electrode member 15 has substantially minimum-phase and maximum-phase impulse responses for the surface acoustic waves which are propagated into the apodized electrode member 15 through one and the other of the first and the second extremities that are near to and remote from the main lobe, respectively. In this manner, the apodized electrode member 15 serves as a finite impulse response (FIR) filter which has the substantially minimum-phase and maximum-phase impulse responses for the respective surface acoustic waves.

The fact has been confirmed by the present inventors that the apodized electrode member 15 transduces the first and the second surface acoustic waves collectively into an output electric signal in compliance with a substantially linear-phase impulse response. This is because collision takes place in the apodized electrode member 15 between the first and the second surface acoustic waves subjected to the substantially minimum-phase and maximum-phase impulse responses and because the weighting coefficients of the minimum-phase and the maximum-phase finite impulse response filters are subjected to convolution as a result of nonlinear interaction between the first and the second surface acoustic waves. The substantially linear-phase impulse response results from a product of the substantially minimum-phase and maximum-phase impulse responses. The output electric signal is derived from the apodized electrode member 15 across the first lead 21 and ground.

It will again be assumed that the apodized electrode member 15 is used as the driving transducer. A first surface acoustic wave is propagated towards the first interdigital electrode member 16 through the first extremity. A second surface acoustic wave travels towards the second interdigital electrode member 17 through the second extremity. In the illustrated example wherein the apodized electrode member 15 has the main lobe near to the first extremity and remote from the second extremity, the first surface acoustic wave is subjected to a substantially minimum-phase impulse response. The second surface acoustic wave is subjected to a substantially maximum-phase impulse response.

Arriving at the first interdigital electrode member 16, the first surface acoustic wave excites a first electric signal in the first interdigital electrode member 16. Similarly, the second surface acoustic wave excites a second electric signal in the second interdigital electrode member 17. Including the second lead 22, the connecting arrangement combines the first and the second electric signals into an output electric signal. The fact has been confirmed by the instant inventors that the output electric signal is produced with the input electric signal subjected to a substantially linear-phase impulse response.

Figure 5:
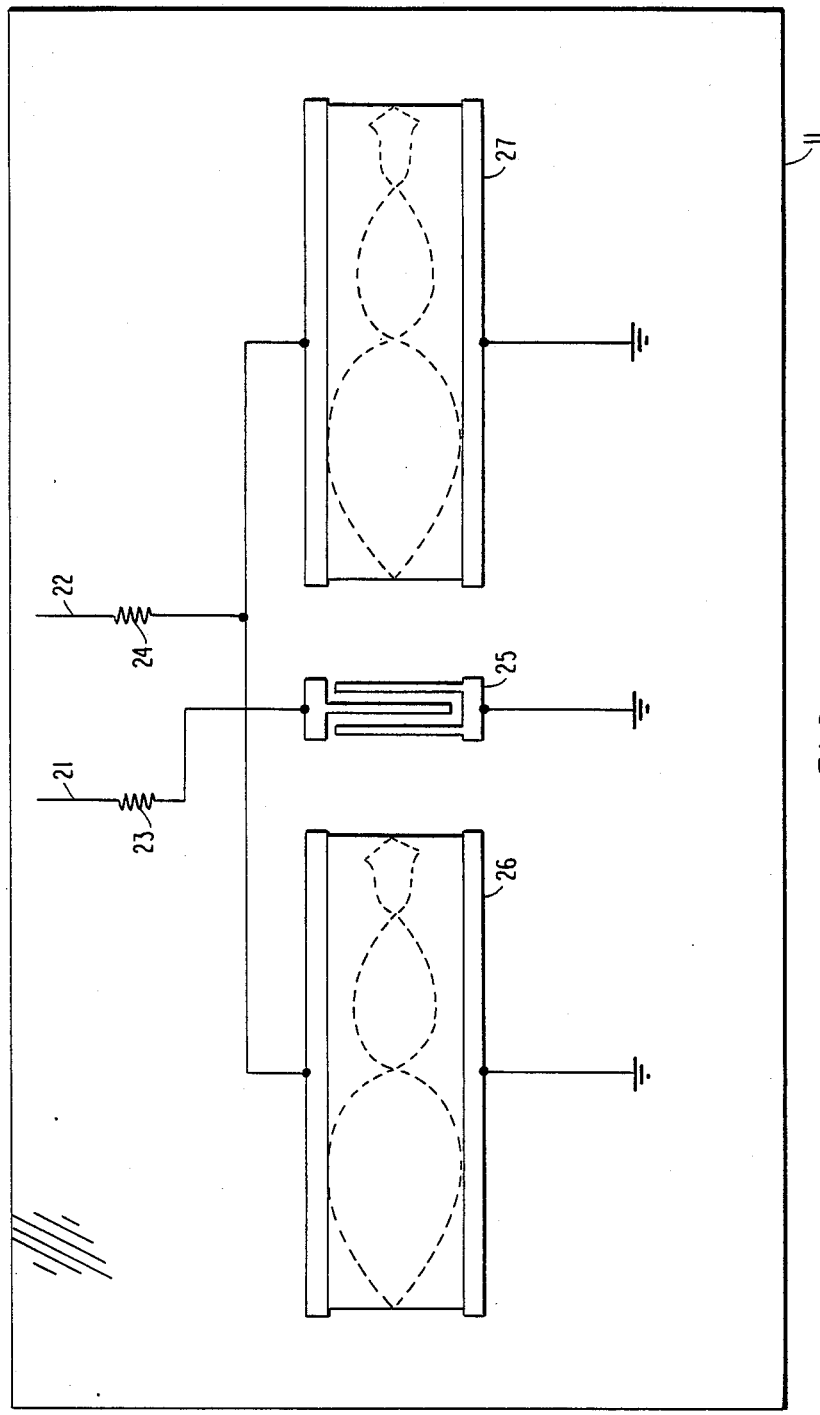
FIG. 5 is a schemitic top view of a surface acoustic wave device according to a second embodiment of this invention.

Referring now to FIG. 5, the description will proceed to a surface acoustic wave device according to a second embodiment of this invention. The surface acoustic wave device comprises similar parts which are designated by like reference numerals and are likewise operable. For example, the surface acoustic wave device comprises a substrate 11 which is similar to that described in connection with FIG. 1.

An interdigital electrode member 25 is formed centrally on the principal surface of the substrate 11. First and second apodized electrode members 26 and 27 are formed on the principal surface leftwardly and rightwardly of the figure. Each of the electrode members 25 through 27 comprises first and second strip electrodes of the type described in connection with FIG. 1. The interdigital electrode member 25 comprises interdigital electrodes and may be whichever of the normal and the modified types. The apodized electrode member 26 or 27 has weighted finger electrodes. The interdigital electrode member 25 has first and second ends. Each of the apodized electrode members 26 and 27 has first and second extremities. It will be surmised that the first end or extremity is depicted leftwardly of the figure. The second end or extremity is shown rightwardly of the figure. Gaps are formed in the finger electrodes in the manner illustrated by dashed-line curves.

The first apodized electrode member 26, the interdigital electrode member 25, and the second apodized electrode member 27 are arranged in succession in the manner described in connection with FIG. 1. It will be seen in the example being illustrated in FIG. 5 that the first apodized electrode member 26 has the main lobe remote from the interdigital electrode member 25. The first apodized electrode member 26 therefore has the first and the second extremities near to and remote from the main lobe, respectively. This applies to the second apodized electrode member 27.

Like in FIG. 1, first and second leads are depicted at 21 and 22. The first lead 21 is electrically connected to the first strip electrode of the interdigital electrode member 25. The second lead 22 is electrically connected to the first strip electrodes of the first and the second apodized electrode members 26 and 27. Ground is applied to the second strip electrodes of the electrode members 25 through 27. In cooperation with the ground applied to the second strip electrodes of the first and the second apodized electrode members 26 and 27, the second lead 22 serves as a connecting arrangement for electrically connecting the first and the second apodized electrode members 26 and 27 together.

It is now understood that the surface acoustic wave device operates as a three-transducer device. For example, the interdigital electrode member 25 is used as a driving transducer. The first and the second apodized electrode members 26 and 27 are used as driven transducers. The first lead 21 is used as an input lead with the second lead 22 used as an output lead.

When an input electric signal of an input high frequency is supplied to the interdigital electrode member 25 across the first lead 21 and ground, a first surface acoustic wave is propagated towards the first apodized electrode member 26. A second surface acoustic wave is propagated towards the second apodized electrode member 27.

The first surface acoustic wave enters the first apodized electrode member 26 through the second extremity. The second surface acoustic wave enters the second apodized electrode member 27 through the first extremity. In as much as the first and the second extremities are near to and remote from the main lobe in the example being illustrated, the first surface acoustic wave is transduced by the first apodized electrode member 26 into a first electric signal in accordance with a substantially maximum-phase impulse response. The second apodized electrode member 27 transduces the second surface acoustic wave into a second electric signal according to a substantially minimum-phase impulse response. It has been confirmed by the present inventors that the connecting arrangement combines the first and the second electric signals into an output electric signal with the input electric signal subjected to a substantially linear-phase impulse response.

Like the surface acoustic wave device illustrated with reference to FIG. 1, it is possible to use the first and the second apodized electrode members 26 and 27 as driving transducers. In this event, the interdigital electrode member 25 is used as a driven transducer. The first and the second leads 21 and 22 are used as an output and an input lead. Under the circumstances, the connecting arrangement supplies the input electric signal to the first and the second apodized electrode members 26 and 27 as first and second electric signals, respectively.

The first apodized electrode member 26 transduces the first electric signal into a first surface acoustic wave which is propagated towards the interdigital electrode member 25 through the second extremity. The second apodized electrode member 27 transduces the second electric signal into a second surface acoustic wave which travels towards the interdigital electrode member 25 through the first extremity. In the manner described above, the first and the second surface acoustic waves are subjected to substantially maximum-phase and minimum-phase impulse responses, respectively. It has been confirmed by the instant inventors that the interdegital electrode member 25 transduces the first and the second surface acoustic waves collectively into an output electric signal with the input electric signal subjected to a substantially linear-phase impulse response.

The apodized electrode members 26 and 27 are called first and second ones merely for convenience of reference. Depending on the circumstances, the rightside one 27 may be called a first apodized electrode member with the leftside one 26 called a second apodized electrode member.

Referring to FIG. 6, a band-pass filter has passband and rejection-band characteristics with frequency F and attenuation A arbitrarily scaled along the abscissa and the ordinate. It will readily be understood that the illustrated characteristics are simplified ones. For example, one or a few ripples are inevitable in the passband characteristic.

Such a band-pass filter is implemented by whichever of the surface acoustic wave devices illustrated with reference to FIGS. 1 and 5. In the rejection band, the attenuation is equal to a sum of the attenuations achieved by the substantially minimum-phase and maximum-phase impulse responses.

Turning to FIG. 7, zero points or zeros are indicated by small circles on a z-plane representative of the z-transform of a substantially linear-phase impulse response. Two radius vectors correspond to the passband characteristic of the type exemplified in FIG. 6. It will be seen that a plurality of zero points are on a unit circle in accordance with the attenuation characteristic. Two zero points are on each radius vector in a mirror image relation with respect to the unit circle.

Referring to FIG. 8, zero points are likewise indicated on a z-plane representative of the z-transform of a substantially minimum-phase impulse response. In contrast to the zero points depicted in FIG. 7 on the radius vectors outwardly and inwardly of the unit circle, the substantially minimum-phase impulse response has two double zero points inside the unit circle. Each double zero point is indicated by a small double circle. The number of the double zero points is from two to five or six. Such double zero points make contribution to the passband characteristic.

Referring to FIG. 9, zero points are similarly indicated on a z-plane representative of the z-transform of a substantially maximum-phase impulse response. A double zero point is on each radius vector outwardly of the unit circle.

Reviewing FIGS. 1, 5, and 6, an attenuation characteristic is presumed on designing a surface acoustic wave device according to this invention. For example, the passband has a center frequency at 70 MHz. The attenuation characteristic has lower and upper passband edges at 69.4 Mhz and 70.6 MHz, lower and upper rejection band edges at 69 MHz and 71 MHz, a rejection band attenuation of 70 dB or more, and a ripple of 2 dB or less in the passband. In consideration of the attenuation characteristic, the taps or pairs of the interdigital electrode member 16, 17, or 25 are 140 in number.

Under the circumstances, the substantially minimum-phase finite impulse response filter should have a rejection band attenuation of 30 dB and a ripple of 2 dB in the passband. A substantially linear-phase finite impulse response filter is designed at first according to an article contributed by J. H. McClellan et al. to the IEEE Transactions on Audio and Electroacoustics, Volume AU-21, No. 6 (Dec. 1973), pages 506 to 526, under the title of "A Computer Program for Designing Optimum FIR Linear Phase Digital Filters".

The substantially linear-phase finite impulse response filter is subsequently modified into the substantially minimum-phase finite impulse response filter according to a report contributed by Hiromi Ueda et al in Japanese to "Densi ZyôhôTûsin Gakkai Gizyutu Hôkoku", CST 78-6 (Apr. 1978), pages 35 to 40, under the title of "On a Design of FIR Filters with Minimum Phase" according to the authors. The number of taps is 346 for the apodized electrode member 15, 26, or 27.

It may be mentioned here that secondary effects give rise to a relatively high ripple in the passband to deteriorate the band-rejection characteristic near the passband. Main secondary effects are the triple transit echo known in the art as TTE and the effect caused by diffraction. Most of the triple transit echo is avoided by using the three-transducer device of FIG. 1 or 5 and the double electrode geometry illustrated above with reference to FIGS. 2 through 4. The diffraction effect has already been discussed by many authors. It is believed by the present inventors that an excellent method is published by Y. Yamamoto et al. in the IEEE Ultrasonic Symposium Proceedings, Nov. 1985, pages 48 to 52, under the title of "SAW Diffraction Analysis and Correction by Waveguide Approximation".

With reference to the McClellan et al. article, the Ueda et al report, and the Yamamoto et al method, the weighting or apodization coefficients are calculated. The result is shown in FIG. 4 with closest possible approximation and with the finger electrodes reduced in number merely for clarity of illustration.

Surface acoustic wave devices were manufactured by using the result obtained as above. A 38°40'-rotated Y cut quartz plate was used as the substrate 11. Each quartz plate had a size of 13 mm by 23 mm and a thickness of 0.38 mm for the surface acoustic wave device illustrated with reference to FIG. 1. The above-mentioned longer sides were parallel to the X propagation axis. The principal surface was polished in the conventional manner. Backside processing is preferred on another principal surface which is opposite to the principal surface thus far referred to.

The apodized and the first and the second interdigital electrode members 15 through 17 were given a common aperture of fifty wavelengths, namely, an inside-to-inside distance of 2.24 mm between the first and the second strip electrodes. The 140 taps corresponded to a length of 3.14 mm for each interdigital electrode member 16 or 17. The 346 taps corresponded to a length of 7.78 mm for the apodized electrode member 15. Each of the first and the second spaces was 0.45 mm wide. Each strip electrode had a width of ten wavelengths. The width is not critical.

A photomask prototype was manufactured for the electrode members 15 through 17 in the known manner. Transferring the prototype on each substrate 11, aluminium electrodes were formed to a film thickness of 1,000 Å. The first and the second leads 21 and 22 and grounding leads were thermocompression bonded to the strip electrodes. If desired, it is possible to manufacture each set of the three transducers by resorting to the known techniques of forming a photomask pattern on the principal surface of a substrate 11 and selectively etching the photolithographic pattern for evaporation of the aluminium electrodes as the strip, the interdigatal, and the finger electrodes.

Each surface acoustic wave device had an effective amount of attenuation which was 65 dB or more in the rejection band between 66 MHz and 74 MHz with no spurious characteristics. It was found that the surface acoustic wave device had about twice as great an attenuation amount when compared with a conventional one which has an approximately same chip size. An overall loss was reduced by 3 dB in the passband. When input and output impedances were used in the first and the second leads 21 and 22 to attain the impedance match, the insertion loss was only 8 dB. The output electric signal had a group delay distortion of 20 nanoseconds or less in the passband.

In the conventional surface acoustic wave device comprising two apodized electrode members, either a multistrip coupler or a waveguide must be used between the driving and the driven transducers. In the conventional surface acoustic wave device comprising an interdigital and an apodized electrode member, use of the modified type has resulted in a considerable amount of error. In contrast, the surface acoustic wave device has a simple structure according to this invention. Moreover, an interdigital electrode member 16, 17, or 25 of the modified type does not materially deteriorate the filter characteristics.

It will now be readily possible for one skilled in the art to manufacture and use a surface acoustic wave device according to this invention. Incidentally, the substrate 11 is not restricted to the quartz plate of the type described above.

What is claimed is:

1. A surface acoustic wave device including an interdigital electrode member having first and second ends and a predetermined width of interlock and a first apodized electrode member having a substantially minimum-phase impulse response for a first surface acoustic wave propagated between said interdigital and said first apodized electrode member through said first end, wherein the improvement comprises a second apodized electrode member and connecting means for electrically connecting said first and said second apodized electrode members together, said second apodized electrode member having a substantially maximum-phase impulse response to a second surface acoustic wave propagated between said interdigital and said second apodized electrode members through said second end.

2. A surface acoustic wave device as claimed in claim 1, further comprising input means for supplying an input electric signal to said interdigital electrode member to make said interdigital electrode member transduce said input electric signal into said first and said second surface acoustic waves, and output means for deriving an output electric signal from said connecting means, said first apodized electrode member transducing said first surface acoustic wave into a first electric signal, said second apodized electrode member transducing said second surface acoustic wave into a second electric signal, said connecting means combining said first and said second electric signals into said output electric signal.

3. A surface acoustic wave device as claimed in claim 2, wherein said interdigital electrode member comprises a plurality of interdigital electrodes which are arranged between said first and said second ends with said predetermined width of interlock and with a uniform density distribution.

4. A surface acoustic wave device as claimed in claim 2, wherein said interdigital electrode member comprises a plurality of interdigital electrodes which are arranged between said first and said second ends with said predetermined width of interlock and with a density distribution varied according to a predetermined rule.

5. A surface acoustic wave device as claimed in claim 1, further comprising input means for supplying an input electric signal to said connecting means to make said connecting means supply said input electric signal to said first and said second apodized electrode members as first and second electric signals, respectively, and output means for deriving an output electric signal from said interdigital electrode member, said first apodized electrode member transducing said first electric signal into said first surface acoustic wave, said second apodized electrode member transducing said second electric signal into said second surface acoustic wave, said interdigital electrode member transducing said first and said second surface acoustic waves collectively into said output electric signal.

6. A surface acoustic wave device as claimed in claim 5, wherein said interdigital electrode member comprises a plurality of interdigital electrodes which are arranged between said first and said second ends with said predetermined width of interlock and with a uniform density distribution.

7. A surface acoustic wave device as claimed in claim 5, wherein said interdigital electrode member comprises a plurality of interdigital electrodes which are arranged between said first and said second ends with said predetermined width of interlock and with a density distribution varied according to a predetermined rule.

* * * * *